(12) United States Patent  (10) Patent No.: US 8,488,366 B2
Kurosawa et al.  (45) Date of Patent: Jul. 16, 2013

(54) SEMICONDUCTOR MEMORY DEVICE

(75) Inventors: Tomonori Kurosawa, Zama (JP); Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 13/043,681

(22) Filed: Mar. 9, 2011

(65) Prior Publication Data

US 2011/0222331 A1    Sep. 15, 2011

(30) Foreign Application Priority Data

Mar. 11, 2010    (JP) .................................. P2010-54025

(51) Int. Cl.
    *G11C 11/00*    (2006.01)
(52) U.S. Cl.
    USPC ....... 365/148; 365/163; 365/185.19; 365/236
(58) Field of Classification Search
    USPC .................. 365/148, 163, 185.19, 236, 233.1
    See application file for complete search history.

(56) References Cited

U.S. PATENT DOCUMENTS

| 7,486,536 B2 * | 2/2009 | Kim et al. ...................... 365/148 |
| 7,558,099 B2 * | 7/2009 | Morimoto ...................... 365/148 |
| 7,643,373 B2 | 1/2010 | Sheu et al. | |
| 2010/0195372 A1 | 8/2010 | Toda | |

FOREIGN PATENT DOCUMENTS

| JP | 2007-4849 A | 1/2007 |
| WO | WO 2009/013819 A1 | 1/2009 |
| WO | WO 2009/145308 A1 | 12/2009 |

OTHER PUBLICATIONS

Office Action issued May 29, 2012, in Japanese Patent Application No. 2010-054025 with English translation.
U.S. Appl. No. 12/885,013, filed Sep. 17, 2010, Hiroshi Kanno et al.
U.S. Appl. No. 12/885,815, Sep. 20, 2010, Takahiko Sasaki.

* cited by examiner

*Primary Examiner* — Son Dinh
(74) *Attorney, Agent, or Firm* — Oblon, Spivak, McClelland, Maier & Neustadt, L.L.P.

(57) ABSTRACT

A semiconductor memory device in accordance with an embodiment includes: a memory cell array having memory cells disposed at respective intersections of first lines and second lines; and a control circuit configured to apply a first pulse voltage multiple times to selected one of the first lines and selected one of the second lines, such that a certain potential difference is applied to a selected memory cell thereby causing transition of a resistance state. The control circuit is configured to, when the selected memory cell is not caused to undergo transition of the resistance state even after application of the first pulse voltage a certain number of times, execute a rescue operation where a second pulse voltage is applied to the selected memory cell subsequent to application of the first pulse voltage, the second pulse voltage having a pulse width longer than that of the first pulse voltage.

20 Claims, 6 Drawing Sheets

SEMICONDUCTOR MEMORY DEVICE

CROSS REFERENCE TO RELATED APPLICATION

This application is based upon and claims the benefit of priority from prior Japanese Patent Application No. 2010-54025, filed on Mar. 11, 2010, the entire contents of which are incorporated herein by reference.

BACKGROUND

1. Field

Embodiments described in this specification relate to a semiconductor memory device.

2. Description of the Related Art

In recent years, resistance varying memory devices employing a variable resistor as a memory element are attracting attention as candidates to succeed flash memory. The resistance varying memory devices are assumed here to include not only the narrowly-defined resistance varying memory (ReRAM: Resistive RAM), in which a transition metal oxide is used as a recording layer to store a resistance state of the transition metal oxide in a non-volatile manner, but also the likes of phase change memory (PCRAM: Phase Change RAM), in which chalcogenide or the like is used as a recording layer to utilize resistance information of a crystalline state (conductor) and an amorphous state (insulator).

There are known to be two kinds of operation modes in memory cells of a resistance varying memory device. In one, referred to as bipolar type, the polarity of applied voltage is switched to set a high-resistance state and a low-resistance state. In the other, referred to as unipolar type, the voltage value and voltage application time are controlled, thus allowing the high-resistance state and the low-resistance state to be set without switching the polarity of applied voltage.

In the case of unipolar type ReRAM, write of data to the memory cell is performed by applying a certain voltage to the variable resistor for a short time. This causes the variable resistor to change from the high-resistance state to the low-resistance state. This operation to change the variable resistor from the high-resistance state to the low-resistance state is hereinafter referred to as a setting operation. On the other hand, erase of data in the memory cell is performed by applying a certain voltage to the variable resistor that is in the low-resistance state after the setting operation for a long time. The certain voltage applied during the erase operation is lower than that applied during the setting operation. This causes the variable resistor to change from the low-resistance state to the high-resistance state. This operation to change the variable resistor from the low-resistance state to the high-resistance state is hereinafter referred to as a resetting operation. The memory cell adopts, for example, the high-resistance state as a stable state (reset state), and, in the case of binary data storage, write of data is performed by the setting operation in which the reset state is changed to the low-resistance state.

When the setting operation and resetting operation are executed on the resistance varying memory device, a pulse generated in a pulse circuit and having a certain voltage value and pulse width (pulse application time) is applied to a selected memory cell. If these setting operation and resetting operation on the resistance varying memory device are repeated several times, it becomes gradually more difficult for the resistance state of the memory cell to change. In particular, there is a risk of resetting failure occurring, in which the memory cell stops changing to the high-resistance state even if it is applied with a resetting pulse. A memory cell in which resetting failure has occurred does not function as a memory element if left as is. Hence measures are required against resetting failure to prevent the resetting failure from affecting operation of the resistance varying memory device.

DETAILED DESCRIPTION

A semiconductor memory device in accordance with an embodiment comprises: a memory cell array having memory cells, each of the memory cells being disposed at respective intersections of a plurality of first lines and a plurality of second lines, and each of the memory cells including a rectifier and a variable resistor connected in series; and a control circuit configured to apply a first pulse voltage multiple times to selected one of the first lines and selected one of the second lines, such that a certain potential difference is applied to a selected memory cell disposed at the intersection of the selected one of the first lines and the selected one of the second lines thereby causing transition of a resistance state of the selected memory cell. The control circuit is configured to, when the selected memory cell is not caused to undergo transition of the resistance state even after application of the first pulse voltage a certain number of times, execute a rescue operation where a second pulse voltage is applied to the selected memory cell subsequent to application of the first pulse voltage, the second pulse voltage having a pulse width longer than that of the first pulse voltage.

A semiconductor memory device in accordance with an embodiment of the present invention is now described with reference to the drawings.

First Embodiment

Figure 1:
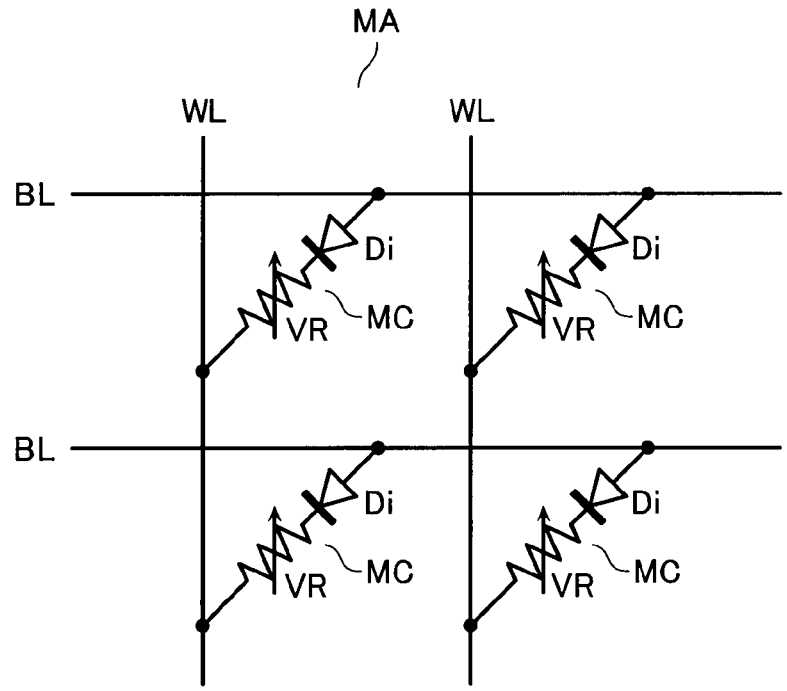
FIG. 1 is an equivalent circuit diagram showing part of a memory cell array in a semiconductor memory device in accordance with a first embodiment.
Figure 2:
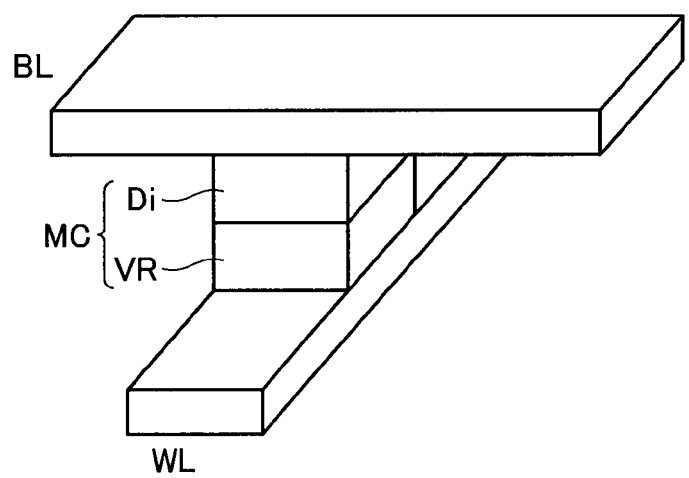
FIG. 2 is a perspective view showing a part of the memory cell array in the semiconductor memory device in accordance with the first embodiment.

Configuration of Semiconductor Memory Device in Accordance with First Embodiment FIGS. 1 and 2 are, respectively, an equivalent circuit diagram and a perspective view of a memory cell array in a semiconductor memory device in accordance with an embodiment of the present invention. This semiconductor memory device includes a plurality of word lines WL disposed in parallel to each other and a plurality of bit lines BL disposed in parallel to each other and intersecting these word lines WL. A memory cell MC is disposed at each of intersections of the word lines WL and bit lines BL, the memory cell MC having its one end connected to the bit line BL and its other end connected to the word line WL, respectively. These bit lines BL, word lines WL, and memory cells MC configure a memory cell array MA.

FIG. 2 is a perspective view showing part of the memory cell array MA shown in FIG. 1. In the memory cell array MA, a memory cell MC is disposed at each of the intersections of the word lines WL and the bit lines BL disposed to intersect these word lines WL. The memory cell MC is a unipolar type comprising a variable resistor VR configured to undergo transition between at least two resistance states of a low-resistance state and a high-resistance state, and a rectifier configured from a non-ohmic element, for example, a diode Di. However, the present invention is not limited to unipolar type memory cells MC, and is applicable also to a semiconductor memory device having bipolar type memory cells MC. Moreover, the order of connection of the variable resistor VR and diode Di, the polarity of the diode Di and so on are likewise not limited to those of the embodiments shown in the drawings.

The semiconductor memory device of the embodiment shown in FIGS. 1 and 2 is configured as a so-called cross point type. In the case of a cross point type configuration, the word lines WL and bit lines BL are configured in a simple line-and-space pattern, and since it is sufficient for the word lines WL and bit lines BL to have an orthogonal positional relationship, there is no need to consider misalignment in the word line WL direction and bit line BL direction. Hence, alignment accuracy in the memory cell array during manufacturing processes can be relaxed, thereby facilitating manufacture.

Utilizable as the variable resistor VR are, for example, ones like chalcogenide or the like in which the resistance is varied due to phase transition between a crystalline state and an amorphous state (PCRAM), ones in which the resistance is varied by precipitating metal cations to form a contacting bridge between the electrodes and ionizing the precipitated metal to destroy the contacting bridge (CBRAM), and ones in which the resistance is varied by voltage or current application (broadly divided into ones in which a resistance variation occurs due to presence/absence of a trapped charge in a charge trap existing in an electrode interface and ones in which a resistance variation occurs due to presence/absence of a conductive path induced by oxygen deficiency or the like) (ReRAM). In particular, utilizable in the case of ReRAM are, for example, $ZnMn_2O_4$, $NiO$, $TiO_2$, $SrZrO_3$, and $Pr_{0.7}Ca_{0.3}MnO_3$.

Immediately after manufacture, the variable resistor VR is in a constant high-resistance state where its resistance value does not change. The variable resistor VR in this state undergoes an operation in which it is applied with a voltage of 5.5 V-6.5 V and a current of 1 $\mu$A-10 $\mu$A for a time of about 20 ms-200 ms (forming operation). This enables the variable resistor VR to undergo transition between the high-resistance state and the low-resistance state, whereby the variable resistor VR is rendered functional as a memory element.

Write of data to the memory cell MC is performed by applying to the memory cell MC a voltage of about 4.5 V-6.0 V for a time of about 20 ns-200 ns. This causes the variable resistor VR to change from the high-resistance state to the low-resistance state (setting operation).

On the other hand, erase of data in the memory cell MC is performed by applying to the memory cell MC in the low-resistance state subsequent to the setting operation a voltage of about 4.3 V-4.6 V for a time of about 10 $\mu$s-100 $\mu$s. This causes the variable resistor VR to change from the low-resistance state to the high-resistance state (resetting operation).

A read operation of the memory cell MC is performed by applying to the memory cell MC a voltage of about 2.5 V and monitoring a current flowing via the variable resistor VR using a sense amplifier. This allows determination of whether the variable resistor VR is in the low-resistance state or the high-resistance state.

When executing the setting operation and resetting operation, a pulse having the above-described certain voltage values and pulse widths (pulse application times) is applied to a selected memory cell MC via a selected bit line and a selected word line. In order to reliably change the resistance state of the selected memory cell MC during the setting operation and resetting operation, the pulse application is executed multiple times. For example, in the case of the resetting operation, the above-mentioned voltage application operation is repeated, and, when the memory cell MC has achieved transition to the high-resistance state, the resetting pulse application operation is stopped. Description of the semiconductor memory device of the present embodiment proceeds below on the assumption that pulse application in the setting operation and resetting operation are performed multiple times. Note that the maximum number of times of the pulse application is, for example, 40.

If the setting operation and resetting operation on the memory cell MC are repeated several times, it becomes gradually more difficult for the resistance state of the variable resistor VR in the memory cell MC to change. In particular, there is a risk of resetting failure occurring, in which the memory cell stops changing to the high-resistance state even if it is applied with the resetting pulse. For example, if a memory cell MC does not undergo transition to the high-resistance state even after 40 resetting pulse applications, that memory cell MC is determined a resetting failure.

A memory cell MC in which this resetting failure has occurred can be recovered by applying it with a pulse having a pulse width longer than that of the pulse employed in an ordinary setting operation or resetting operation. A memory cell MC "being recovered" refers to the variable resistor VR in the memory cell MC being enabled to undergo transition between the high-resistance state and the low-resistance state and thereby function again as a memory element. A recovery operation on a memory cell MC determined a resetting failure is performed by applying to that memory cell MC a voltage of about 4.3 V-4.6 V for a time of about 1 ms-700 ms. This causes the variable resistor VR to change to the high-resistance state and to be enabled to undergo transition between the high-resistance state and the low-resistance state. This operation causing the memory cell MC to recover is hereinafter referred to as a rescue operation. This rescue operation enables the operating life of the memory cell MC to be extended and reliability of the semiconductor memory device to be increased.

Next, a configuration of a control circuit and so on in the semiconductor memory device of the present embodiment utilized for performing this rescue operation are described.

Figure 3:
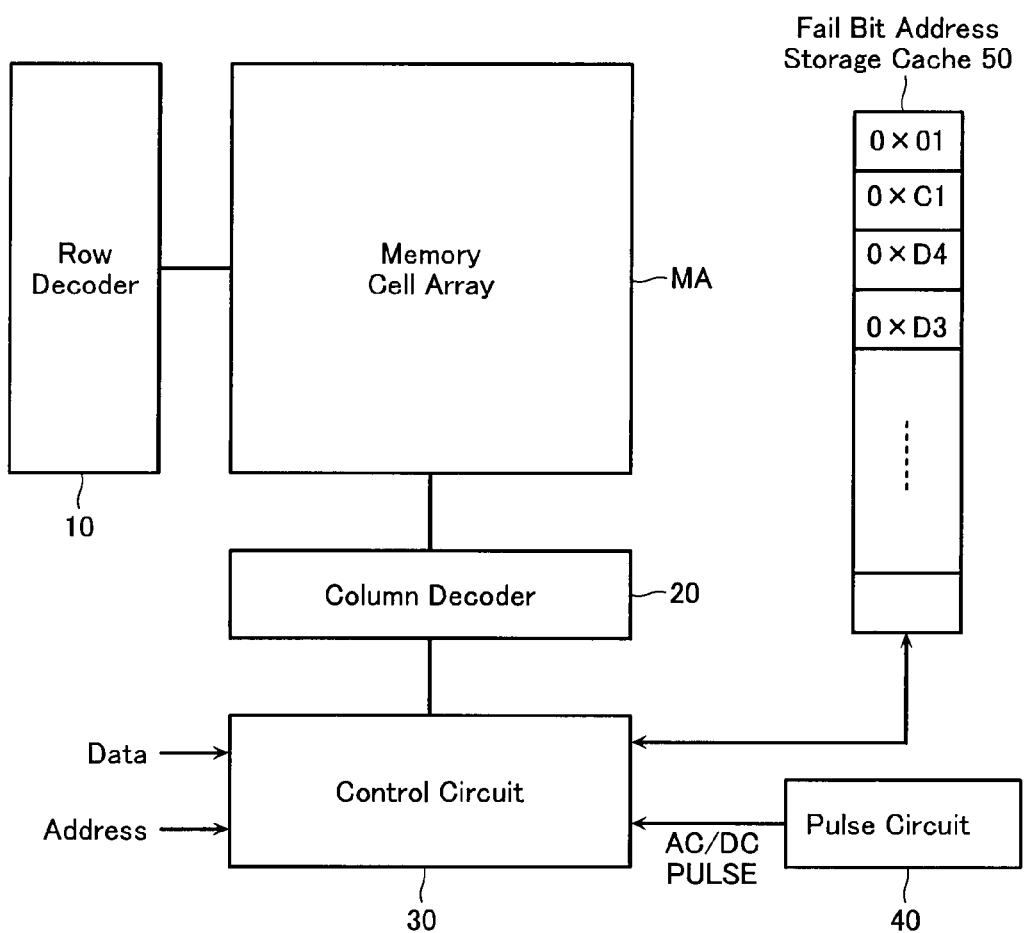
FIG. 3 is a block diagram showing a configuration of the semiconductor memory device in accordance with the first embodiment.

FIG. 3 is a block diagram showing a configuration of the semiconductor memory device in accordance with the present embodiment. The semiconductor memory device comprises the memory cell array MA including the word lines WL, bit lines BL, and memory cells MC mentioned above. In addition, the semiconductor memory device comprises: a row decoder 10 configured to selectively drive the word lines WL; a column decoder 20 configured to selectively drive the bit lines BL; and a control circuit 30 configured to control operation of the semiconductor memory device. The control circuit 30 receives, as input from external, an address signal for selecting the memory cell MC in the memory cell array MA to undergo read/write, and data to be written to the selected memory cell MC. The control circuit 30 controls operations on the selected memory cell MC based on this address signal and data. A pulse circuit 40 supplies a pulse to the row decoder 10 and column decoder 20, via the control circuit 30, the pulse having a certain voltage value and pulse width corresponding, respectively, to the setting operation, resetting operation, read operation, and rescue operation.

Figure 4A:
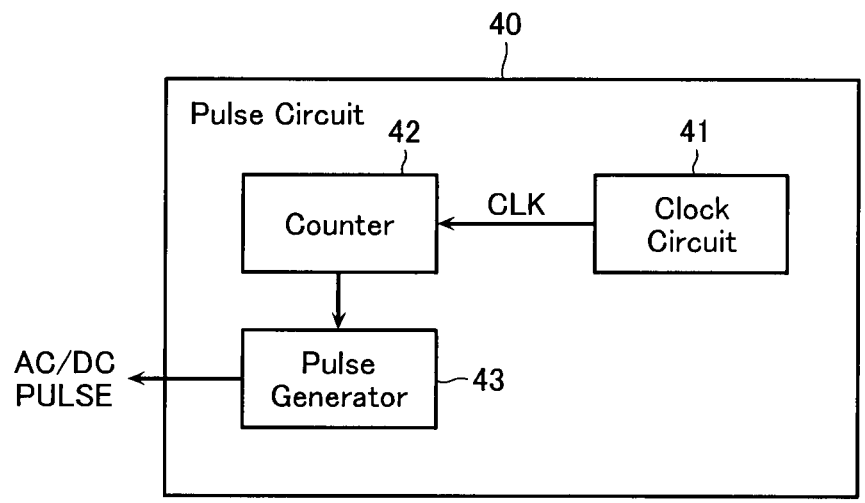
FIG. 4A is a block diagram showing a pulse circuit in the semiconductor memory device in accordance with the first embodiment.
Figure 4B:
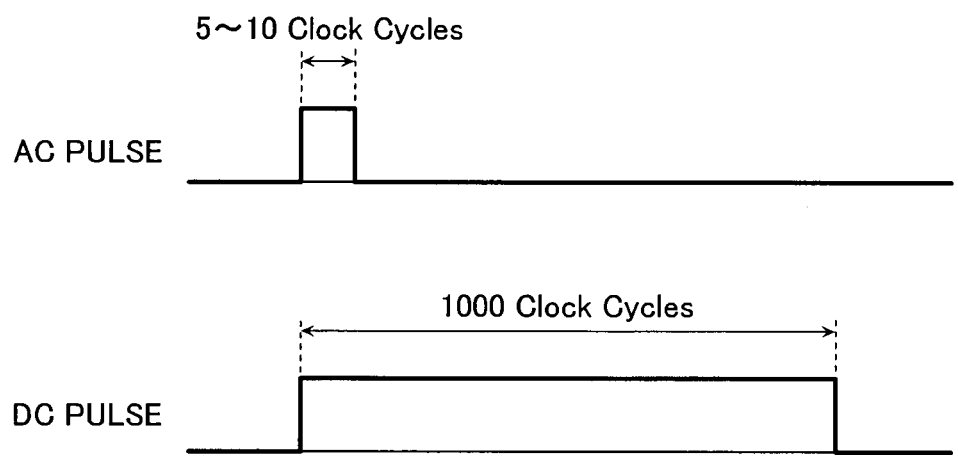
FIG. 4B is a view showing pulses employed in operation of the semiconductor memory device in accordance with the first embodiment.

FIGS. 4A and 4B are, respectively, a block diagram showing a configuration of the pulse circuit 40, and a view showing pulse waveforms generated by the pulse circuit 40 and utilized in the operations.

As shown in FIG. 4A, the pulse circuit 40 comprises: a clock circuit 41 configured to generate a clock signal oscillating with a certain cycle; a counter 42 configured to count a number of oscillations of the clock signal; and a pulse generating circuit 43 configured to generate a pulse having a certain voltage value and pulse width. The pulse generating circuit 43 is configured to enable generation of both a pulse having a comparatively short pulse width employed in such as the normal setting operation and resetting operation, and a pulse having a long pulse width utilized in the rescue operation. The pulse width is determined based on the time that the counter 42 counts the number of oscillations of the clock signal.

As shown in FIG. 4B, when generating the pulse used in the likes of the setting operation and resetting operation, the pulse width is defined as the time taken for the counter 42 to count, for example, 5-10 oscillations of the clock signal. This pulse having a comparatively short pulse width employed in such as the setting operation and resetting operation is hereinafter referred to as an AC pulse. When generating the pulse having a long pulse width employed in the rescue operation, the pulse width is defined as the time taken for the counter 42 to count, for example, 1000 oscillations of the clock signal. This pulse having a comparatively long pulse width employed in the rescue operation is hereinafter referred to as a DC pulse.

In addition, as shown in FIG. 3, the semiconductor memory device comprises a fail bit address storage cache 50. The cache 50 stores an address within the memory cell array MA of a memory cell MC that is not caused to undergo transition to the high-resistance state even after multiple times (for example, 40 times) of resetting pulse applications (that is, a resetting failure memory cell MC). The rescue operation can be executed on the resetting failure memory cell MC based on this address stored in the cache 50. The control circuit 30 is configured to allow control of the following, namely, determination of whether or not the memory cell MC is a resetting failure, delivery of an address of a memory cell MC which is a resetting failure to the cache 50, pulse generation required in operations, and so on, also to be performed.

Operation of Semiconductor Memory Device in Accordance with First Embodiment

Figure 5:
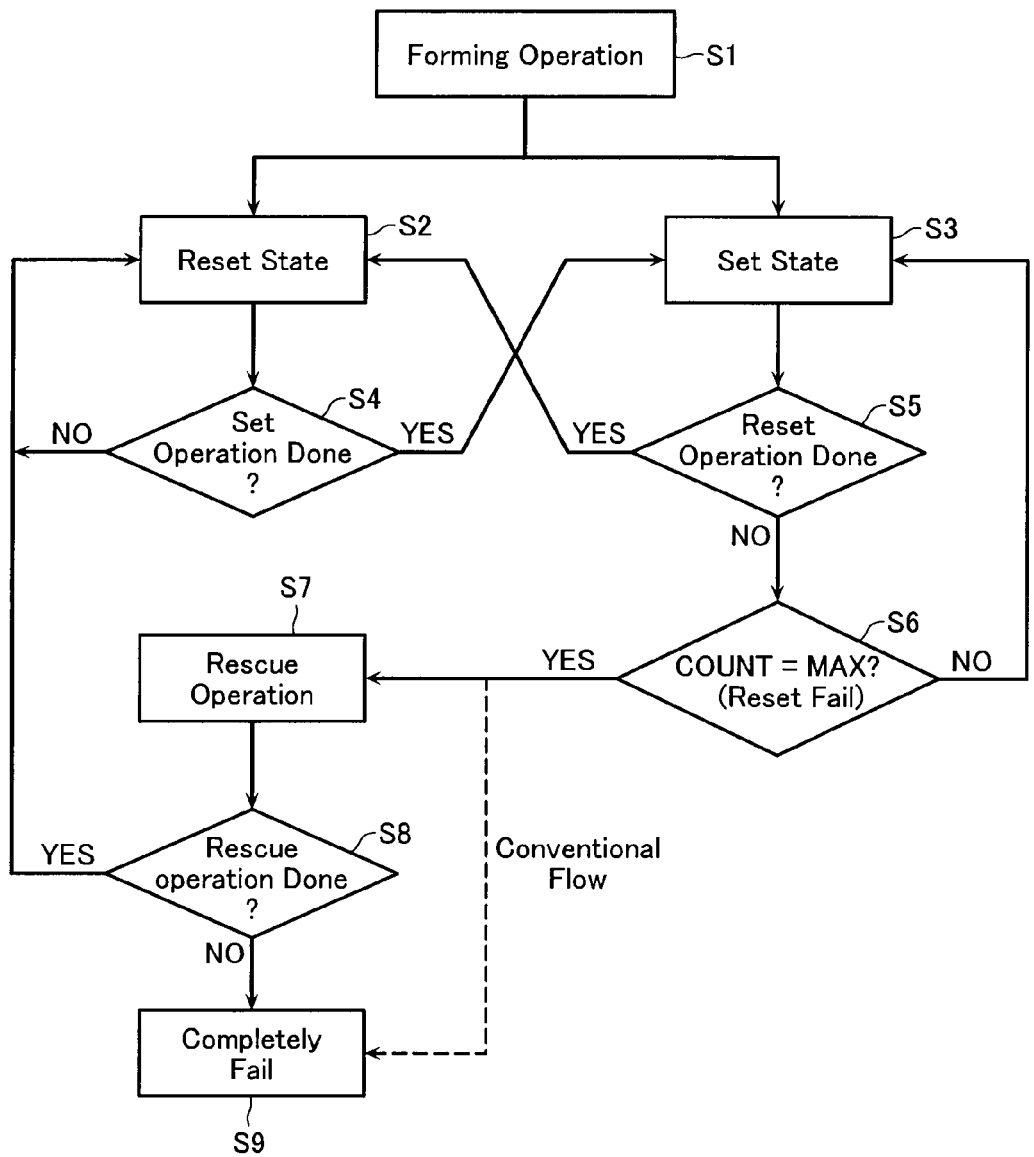
FIG. 5 is a flowchart explaining operation of the semiconductor memory device in accordance with the first embodiment.

Next, operation of the semiconductor memory device in accordance with the present embodiment configured as above is described. FIG. 5 is a flowchart explaining operation of the semiconductor memory device in accordance with the present embodiment.

First, the forming operation is executed on each of the memory cells MC in a semiconductor memory device immediately after manufacture, thereby causing the memory cells MC to function as memory elements (step S1). The memory cell MC during operation becomes either of the low-resistance state (set state) or the high-resistance state (reset state) (steps S2 and S3). The resetting operation is executed on the memory cell MC in the low-resistance state (set state) and the setting operation is executed on the memory cell MC in the high-resistance state (reset state), based on data retained in the semiconductor memory device (steps S4 and S5). Employed in these setting operation and resetting operation is the aforementioned pulse having a short pulse width generated by the pulse circuit 40 (AC pulse).

In the resetting operation, pulse application to the memory cell MC is repeated until a specified number of resetting pulse applications is reached. When the memory cell MC has changed to the high-resistance state, pulse application is stopped. When the memory cell MC does not undergo transition to the high-resistance state even after the specified number (for example, 40) of resetting pulse application operations, that memory cell MC is determined to be a resetting failure (step S6). The memory cell MC determined to be a resetting failure undergoes execution of the rescue operation following the resetting pulse application (step S7). In operation of the semiconductor memory device of the present embodiment, only the memory cell MC determined to be a resetting failure undergoes execution of the rescue operation. Employed in this rescue operation is the aforementioned pulse having a long pulse width generated by the pulse circuit 40 (DC pulse). Determination is performed of whether or not the pulse application of the rescue operation has caused the memory cell MC to undergo transition to the high-resistance state (step S8). When the memory cell MC has undergone transition to the high-resistance state, that memory cell MC is returned to normal operation (steps S2-S5). When the memory cell MC is not caused to undergo transition to the high-resistance state even by the rescue operation, that memory cell MC is determined to have ceased functioning and is excluded from subsequent operation (step S9).

Advantages of Semiconductor Memory Device in Accordance with First Embodiment

During execution of the normal resetting operation, the semiconductor memory device of the present embodiment executes the rescue operation only on a memory cell MC determined to be a resetting failure. The pulse employed in the rescue operation has a pulse width about two to three orders of magnitude longer than that of the pulse employed in normal operation, whereby the rescue operation requires a significantly longer time than the normal operation. As a result, a memory cell MC determined to be a resetting failure in step S6 of FIG. 5 may be excluded from operation directly (refer to broken line arrow). Even in the case of the rescue operation being performed on the resetting failure memory cell MC, there has been a risk that, if it is decided to perform the rescue operation based on a predetermined condition such as number of accesses to the memory cell array MA, the rescue operation will be executed even on memory cells MC not requiring the rescue operation, whereby operation time of the semiconductor memory device is unnecessarily extended.

In contrast, in the semiconductor memory device of the present embodiment, the rescue operation is not executed on a memory cell MC until the memory cell MC is determined to be a resetting failure. In addition, the rescue operation is executed only on the memory cell MC determined to be a resetting failure. The semiconductor memory device of the present embodiment prevents unnecessary rescue operations from being executed, and allows memory cells MC in which a resetting failure has occurred to be recovered while reducing effects on normal operation.

Second Embodiment

Next, a semiconductor memory device in a second embodiment of the present invention is described. The semiconductor memory device of the present embodiment has a memory cell array MA, row decoder 10, column decoder 20, control circuit 30, pulse circuit 40, and cache 50, which are similar to those in the above-described semiconductor memory device of the first embodiment. Parts having an identical configuration to those in the first embodiment are assigned identical symbols in the drawings, to avoid repetitive description.

Operation of Semiconductor Memory Device in Accordance with Second Embodiment

Figure 6:
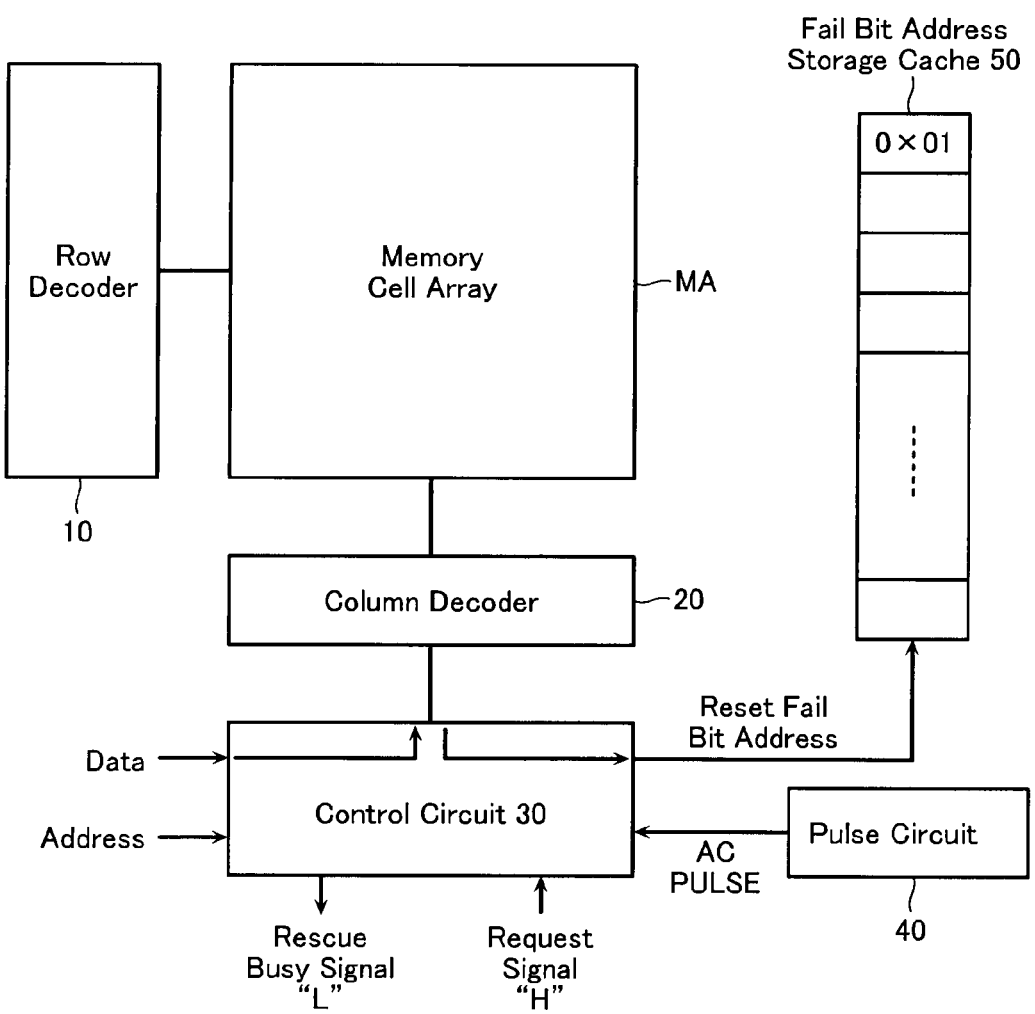
FIG. 6 is a block diagram showing a configuration of a semiconductor memory device in accordance with a second embodiment.
Figure 7:
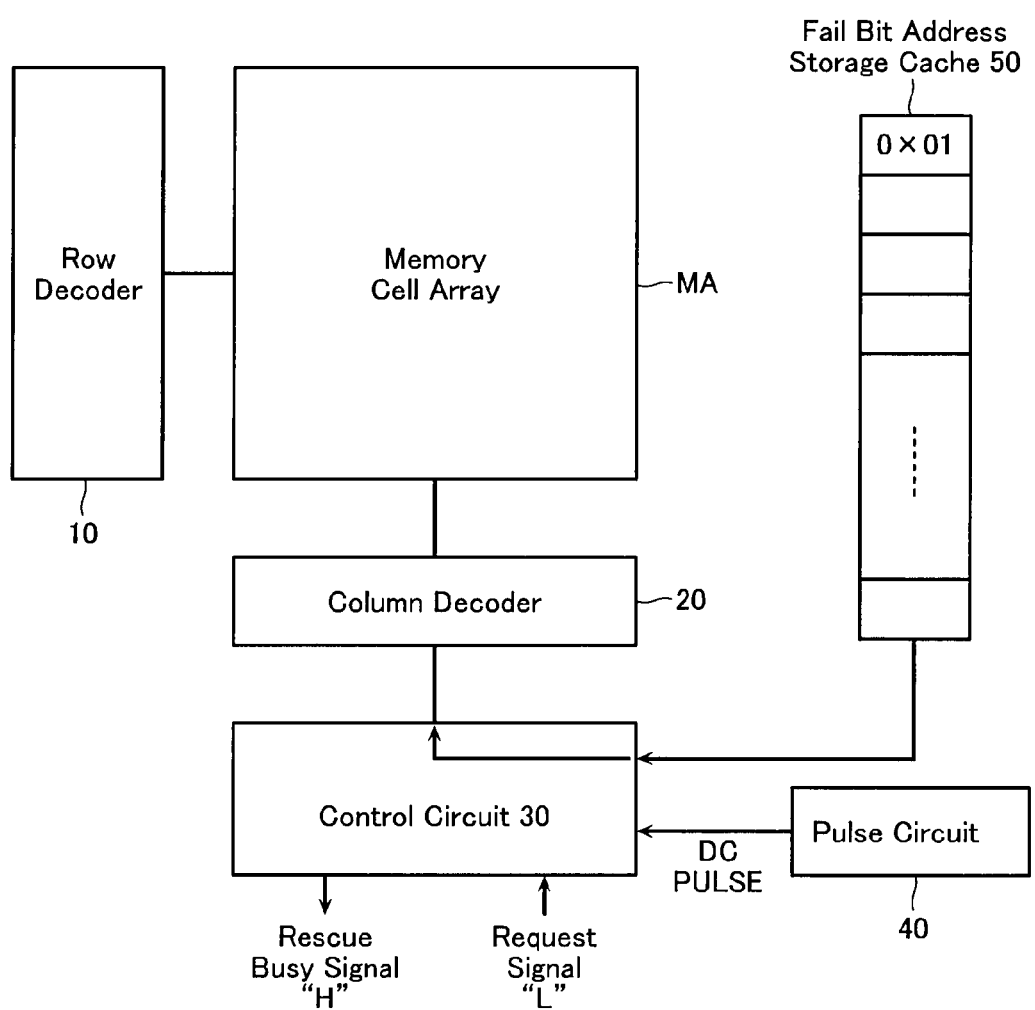
FIG. 7 is a block diagram showing the configuration of the semiconductor memory device in accordance with the second embodiment.

Operation of the semiconductor memory device in the present embodiment is described. FIGS. 6 and 7 are block diagrams explaining operation of the semiconductor memory device in accordance with the present embodiment.

In the semiconductor memory device of the first embodiment, the rescue operation on the memory cell MC determined to be a resetting failure is executed following the normal resetting operation. In contrast, in the semiconductor memory device of the second embodiment, the rescue operation on the memory cell MC determined to be a resetting failure is executed during a standby state of the semiconductor memory device. "Standby state" refers here to a state where power supply of the semiconductor memory device is turned on, but the setting operation, resetting operation, and read operation on the memory cell array MA are not being executed.

The semiconductor memory device shown in FIG. 6 shows a state during a normal write/read operation. The normal write/read operation refers to the aforementioned setting operation, resetting operation, and read operation, and has a required pulse voltage, pulse width, and so on, which are similar to those in the first embodiment.

Switching between the normal write/read operation state and the standby state is controlled by the two signals (rescue signal and request signal). The rescue signal is a signal outputted from the control circuit to external, and the request signal is a signal inputted to the control circuit 30 from external. When the rescue operation is being executed on the resetting failure memory cell MC, the control circuit 30 sets the rescue signal to "H" state. In addition, when the rescue operation is not being executed on the memory cell MC and the normal write/read operation are executable, the control circuit 30 sets the rescue signal to "L" state. When the normal write/read operation are executed, the request signal is in "H" state and data to be written, addresses and so on are inputted to the control circuit 30 from external. In addition, when the normal write/read operation is not executed, the request signal from external is in "L" state.

The semiconductor memory device shown in FIG. 6 has the rescue signal in "L" state and the request signal in "H" state, hence the normal write/read operation is executed. The data to be written, addresses and so on are inputted from external, and the AC pulse employed in the normal write/read operation is supplied from the pulse circuit 40. Now, in the resetting operation, when the memory cell MC does not undergo transition to the high-resistance state even after the specified number (for example, 40) of resetting pulse applications, that memory cell MC is determined to be a resetting failure. In the semiconductor memory device of the present embodiment, if the memory cell MC is determined to be a resetting failure, the address within the memory cell array MA of that memory cell MC is retained in the cache 50.

The semiconductor memory device shown in FIG. 7 has the rescue signal in "H" state and the request signal in "L" state, hence the rescue operation is executed. In the semiconductor memory device of the present embodiment, the address of the memory cell MC determined to be a resetting failure is inputted from the cache 50, and the DC pulse employed in the rescue operation is supplied from the pulse circuit 40. Then the rescue operation is executed on the memory cell MC determined to be a resetting failure. When the memory cell MC is caused to function again as a memory element, the address of that memory cell MC is erased from the cache 50. Now, the rescue operation may be executed simultaneously on a plurality of memory cells MC that have their addresses retained in the cache 50.

Note that when the rescue signal and the request signal are both in "L" state, neither of the rescue operation or the normal write/read operation are being executed. Moreover, when the request signal instructing the write/read operation is inputted midway during execution of the rescue operation, the rescue signal and the request signal both attain "H" state. In this case, the control circuit stops the rescue operation immediately, and, along with setting the rescue signal to "L" state, executes the write/read operation.

Advantages of Semiconductor Memory Device in Accordance with Second Embodiment

In the semiconductor memory device of the present embodiment, the rescue operation on the memory cell MC determined to be a resetting failure is performed during the standby state. Executing the rescue operation following the resetting operation leads to the operation speed of the semiconductor memory device temporarily slowing in spite of the fact that the normal resetting operation is being executed. In contrast, in the semiconductor memory device of the present embodiment, the rescue operation is not executed until the standby state is attained, and the rescue operation never interrupts the normal write/read operation. As a result, effects on normal operation can be reduced to a considerable degree. Moreover, if the rescue operation is executed simultaneously on a plurality of memory cells MC determined to be a resetting failure, then time required for the rescue operation can be reduced.

This concludes description of embodiments of the present invention, but it should be noted that the present invention is not limited to the above-described embodiments, and that various alterations, additions, combinations, and so on, are possible within a range not departing from the scope and spirit of the invention. For example, in the above-described embodiments, the pulse width generated by the pulse circuit 40 is described as differing by two orders of magnitude between the AC pulse and the DC pulse, but the pulse width may be set arbitrarily to that required in each operation. In addition, the embodiments describe the example of resetting failure where the memory cell stops changing to the high-resistance state during the resetting operation. However, the present invention may be applied also to the case where the rescue operation is executed on a memory cell that has stopped changing to the low-resistance state even when applied with a setting pulse during the setting operation.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array having memory cells, each of the memory cells being disposed at respective intersections of a plurality of first lines and a plurality of second lines, and each of the memory cells including a rectifier and a variable resistor connected in series; and
a control circuit configured to apply a first pulse voltage multiple times to selected one of the first lines and selected one of the second lines, such that a certain potential difference is applied to a selected memory cell disposed at the intersection of the selected one of the first lines and the selected one of the second lines thereby causing transition of a resistance state of the selected memory cell,
the control circuit being configured to, when the selected memory cell is not caused to undergo transition of the resistance state even after application of the first pulse voltage a certain number of times, execute a rescue operation where a second pulse voltage is applied to the selected memory cell subsequent to application of the first pulse voltage, the second pulse voltage having a pulse width longer than that of the first pulse voltage.

2. The semiconductor memory device according to claim 1, further comprising:
a fail bit address storage cache configured to retain an address of the selected memory cell when the selected memory cell is not caused to undergo transition of the resistance state even after application of the first pulse voltage a certain number of times.

3. The semiconductor memory device according to claim 1, wherein the variable resistor has at least two resistance states of a low-resistance state and a high-resistance state, and
wherein application of the first pulse voltage is an operation causing transition of the variable resistor in the selected memory cell from the low-resistance state to the high-resistance state.

4. The semiconductor memory device according to claim 1, further comprising a pulse circuit configured to enable the first pulse voltage and the second pulse voltage to be generated.

5. The semiconductor memory device according to claim 4, wherein the pulse circuit comprises:
a clock circuit configured to generate a clock signal that oscillates with a certain cycle;
a counter configured to count a number of oscillations of the clock signal; and
a pulse generating circuit configured to generate the first pulse voltage and the second pulse voltage, each having a certain voltage value and a certain pulse width, and
wherein the pulse circuit determines the pulse widths of the first pulse voltage and the second pulse voltage based on a time that the counter counts the number of oscillations of the clock signal.

6. The semiconductor memory device according to claim 1, wherein, when the selected memory cell is not caused to undergo transition of the resistance state even by the rescue operation, the control circuit excludes the selected memory cell from a subsequent operation.

7. A semiconductor memory device, comprising:
a memory cell array having memory cells, each of the memory cells being disposed at respective intersections of a plurality of first lines and a plurality of second lines, and each of the memory cells including a rectifier and a variable resistor connected in series; and
a control circuit configured to apply a first pulse voltage multiple times to selected one of the first lines and selected one of the second lines, such that a certain potential difference is applied to a selected memory cell disposed at the intersection of the selected one of the first lines and the selected one of the second lines thereby causing transition of a resistance state of the selected memory cell,
the control circuit being configured to, when the selected memory cell is not caused to undergo transition of the resistance state even after application of the first pulse voltage a certain number of times, execute a rescue operation where a second pulse voltage is applied to the selected memory cell during a standby state when the first pulse voltage is not being applied to the memory cells in the memory cell array, the second pulse voltage having a pulse width longer than that of the first pulse voltage.

8. The semiconductor memory device according to claim 7, further comprising:
a fail bit address storage cache configured to retain an address of the selected memory cell when the selected memory cell is not caused to undergo transition of the resistance state even after application of the first pulse voltage a certain number of times.

9. The semiconductor memory device according to claim 7, wherein the variable resistor has at least two resistance states of a low-resistance state and a high-resistance state, and
wherein application of the first pulse voltage is an operation causing transition of the variable resistor in the selected memory cell from the low-resistance state to the high-resistance state.

10. The semiconductor memory device according to claim 7, wherein the control circuit switches between an operation which applies the first pulse voltage to cause transition of the resistance state of the selected memory cell, and the rescue operation, based on a request signal inputted to the control circuit and a rescue signal outputted from the control circuit.

11. The semiconductor memory device according to claim 7, further comprising a pulse circuit configured to enable the first pulse voltage and the second pulse voltage to be generated.

12. The semiconductor memory device according to claim 11, wherein the pulse circuit comprises:
a clock circuit configured to generate a clock signal that oscillates with a certain cycle;
a counter configured to count a number of oscillations of the clock signal; and
a pulse generating circuit configured to generate the first pulse voltage and the second pulse voltage, each having a certain voltage value and a certain pulse width, and
wherein the pulse circuit determines the pulse widths of the first pulse voltage and the second pulse voltage based on a time that the counter counts the number of oscillations of the clock signal.

13. The semiconductor memory device according to claim 7,
wherein, when the selected memory cell is not caused to undergo transition of the resistance state even by the rescue operation, the control circuit excludes the selected memory cell from a subsequent operation.

14. A semiconductor memory device, comprising:
a memory cell array having memory cells, each of the memory cells being disposed at respective intersections of a plurality of first lines and a plurality of second lines, and each of the memory cells including a rectifier and a variable resistor connected in series; and
a control circuit configured to apply a first pulse voltage multiple times to selected one of the first lines and selected one of the second lines, such that a certain potential difference is applied to a selected memory cell disposed at the intersection of the selected one of the first lines and the selected one of the second lines thereby causing transition of a resistance state of the selected memory cell,
the control circuit being configured to, when the selected memory cell is not caused to undergo transition of the resistance state even after application of the first pulse voltage a certain number of times, execute a rescue operation where a second pulse voltage is applied to the selected memory cell, the second pulse voltage having a pulse width longer than that of the first pulse voltage.

15. The semiconductor memory device according to claim 14, further comprising:
a fail bit address storage cache configured to retain an address of the selected memory cell when the selected memory cell is not caused to undergo transition of the resistance state even after application of the first pulse voltage a certain number of times.

16. The semiconductor memory device according to claim 14,
wherein the variable resistor has at least two resistance states of a low-resistance state and a high-resistance state, and
wherein application of the first pulse voltage is an operation causing transition of the variable resistor in the selected memory cell from the low-resistance state to the high-resistance state.

17. The semiconductor memory device according to claim 14,
wherein the control circuit switches between an operation which applies the first pulse voltage to cause transition of the resistance state of the selected memory cell, and the rescue operation, based on a request signal inputted to the control circuit and a rescue signal outputted from the control circuit.

18. The semiconductor memory device according to claim 14, further comprising a pulse circuit configured to enable the first pulse voltage and the second pulse voltage to be generated.

19. The semiconductor memory device according to claim 18,
wherein the pulse circuit comprises:
a clock circuit configured to generate a clock signal that oscillates with a certain cycle;
a counter configured to count a number of oscillations of the clock signal; and
a pulse generating circuit configured to generate the first pulse voltage and the second pulse voltage, each having a certain voltage value and a certain pulse width, and
wherein the pulse circuit determines the pulse widths of the first pulse voltage and the second pulse voltage based on a time that the counter counts the number of oscillations of the clock signal.

20. The semiconductor memory device according to claim 14,
wherein, when the selected memory cell is not caused to undergo transition of the resistance state even by the rescue operation, the control circuit excludes the selected memory cell from a subsequent operation.

* * * * *